(12) United States Patent
Kawano et al.

(10) Patent No.: US 6,265,784 B1
(45) Date of Patent: Jul. 24, 2001

(54) RESIN SEALED SEMICONDUCTOR DEVICE HAVING IMPROVED ARRANGEMENT FOR REDUCING THERMAL STRESS WITHIN THE DEVICE

(75) Inventors: Kenya Kawano, Ibaraki-ken; Hiroaki Doi, Tsuchiura; Akio Yasukawa, Kashiwa; Hideo Miura, Koshigaya, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/437,266

(22) Filed: Nov. 10, 1999

(30) Foreign Application Priority Data

Nov. 10, 1998 (JP) .................................................. 10-318677

(51) Int. Cl.[7] .......................... H01L 23/00; H01L 23/28; H01L 23/02; H01L 29/40
(52) U.S. Cl. ........................... 257/788; 257/791; 257/787; 257/781; 257/789; 257/778; 257/737; 257/790
(58) Field of Search ..................................... 257/788–791, 257/737, 738, 734, 692, 693, 787, 778

(56) References Cited

U.S. PATENT DOCUMENTS 5,349,240 * 9/1994 Norita et al. .......................... 257/791
6,049,128 * 4/2000 Kitano et al. ......................... 257/737

FOREIGN PATENT DOCUMENTS 7-66326   3/1995   (JP) .

* cited by examiner

Primary Examiner—Alexander O. Williams
(74) Attorney, Agent, or Firm—Antonelli, Terry, Stout & Kraus, LLP

(57) ABSTRACT

A resin sealed semiconductor device is provided with an organic resin wiring substrate, an LSI chip having a semiconductor integrated circuit and mounted in a bare chip package form to the organic resin wiring substrate through a plurality of electrical bonding members, and a resin charged into a gap portion between the organic resin wiring substrate and the LSI chip. In this resin sealed semiconductor device, a modulus of longitudinal elasticity of the resin to be charged, its coefficient of linear thermal expansion and its fillet shape are optimized. The resin charged is also preferably colored in black to minimize adverse effects of visible rags on the LSI chip.

10 Claims, 6 Drawing Sheets

SHAPE1

SHAPE2

SHAPE3

SHAPE4

RESIN SEALED SEMICONDUCTOR DEVICE HAVING IMPROVED ARRANGEMENT FOR REDUCING THERMAL STRESS WITHIN THE DEVICE

BACKGROUND OF THE INVENTION

This invention relates to a resin sealed semiconductor device in which an LSI chip is connected to a wiring substrate. More particularly, this invention relates to a resin sealed semiconductor device having a bare chip package configuration.

So-called "bare chip package" type semiconductor devices according to the prior art have a construction in which an LSI chip is connected to a wiring substrate by metal bumps, or the like. These semiconductor devices are not free from the problem that a thermal strain develops in the metal bumps due to the difference of coefficients of linear thermal expansion between the LSI chip resulting in the wiring substrate, and the metal bumps undergoing fatigue failure. In order to solve this problem, in a known measure, a gap portion between the LSI chip and the wiring substrate is charged with an epoxy type thermosetting resin containing fine particles such as glass particles (generally called "fillers"). With this arrangement, thermal deformation between the LSI chip and the wiring substrate is restricted so that the thermal stress occurring in the metal bumps can be reduced and connection reliability of the metal bumps can be improved.

Such a measure will be explained by taking JP-A-7-66326 by way of example. This prior art reference illustrates a schematic sectional view of a semiconductor device that is produced by packing a resin at peripheral portions of solder bumps that electrically connect a semiconductor chip such as an LSI chip to a glass substrate. This reference proposes to improve connection reliability of the solder bumps by charging the resin into the gap portion between the semiconductor chip and the glass substrate thereby mitigating deformation resulting from the difference of the coefficients of thermal expansion between the semiconductor chip and the glass substrate.

SUMMARY OF THE INVENTION

It is an object of the present invention to provide a resin sealed semiconductor device that can prevent breakage resulting from a thermal stress, is economical, and has high reliability.

It is another object of the present invention to provide a resin sealed semiconductor device that can prevent an erroneous operation of a semiconductor integrated circuit resulting from visible rays.

A lower fabrication cost of semiconductor devices has been required nowadays in addition to their higher performance. Ceramic type substrate materials typified by the glass substrate described above or alumina have a high material cost and a high production cost. If an LSI chip is mounted to an organic resin wiring substrate that is more economical than the ceramic materials, semiconductor devices will be supplied more economically.

When the LSI chip is mounted directly to the organic resin wiring substrate, however, the following problem develops. The difference of coefficients of thermal expansion between an organic resin and silicon as the material of the LSI chip is greater than that between a ceramic substrate and silicon. Therefore, even when a sealing resin is charged in the manner described above, thermal stress acting on the solder bumps, or the like, will increase and will accelerate fatigue failure of the solder bumps. As the difference of coefficients of linear thermal expansion increases, overall thermal deformation of the semiconductor device becomes greater with the result that a large thermal stress occurs in the sealing resin that restricts the thermal deformation, and cracks and peeling will occur in the sealing resin and in the interface of the LSI chip and the wiring substrate, respectively.

When an LSI chip is mounted in a bare chip package, the LSI chip is exposed outside. Therefore, the semiconductor integrated circuit inside the LSI chip is likely to operate erroneously in some cases due to the influences of light. In any event, when the LSI chip is directly mounted on the organic resin material, reliability of the semiconductor device may drop.

In a resin sealed semiconductor device in which the LSI chip is mounted on the organic resin material, therefore, the present invention contemplates to improve thermal fatigue failure life of the solder bumps through optimization of the mechanical properties of the sealing resin. The present invention optimizes also a fillet shape of the sealing resin in order to restrict the cracks inside the sealing resin and restrict interfacial breakage, even when the LSI chip is mounted in the bare chip package form to not only the organic resin wiring substrate but also to the ceramic wiring substrate. In this way, the present invention accomplishes a high reliability resin sealed semiconductor device that improves connection reliability of the solder bumps.

Among the problems described above, the problem of the fatigue failure of the solder bumps can be solved when a sealing resin is selected having mechanical properties capable of reducing the strain that occurs in the metal bumps such as the solder bumps and governs their fatigue life.

The sealing resin in the present invention has a feature in that its modulus of longitudinal elasticity E (MPa) satisfies the relation $3{,}430 \leq E \leq 16{,}000$, and its coefficient of linear thermal expansion $\alpha$ (ppm/° C.) satisfies the following expression (5):

$$\alpha_1(E) \leq \alpha(E) \leq \alpha_2(E) \qquad (5)$$

where:

$$\alpha_1(E) = 6.24 \times 10^{-8} E^2 - 1.38 \times 10^{-3} E + 26.8 \qquad (6)$$

$$\alpha_2(E) = 2.28 \times 10^{-7} E^2 - 5.69 \times 10^{-3} E + 93.6 \qquad (7)$$

$$3{,}430 \leq E \leq 16{,}000 \qquad (8)$$

FIG. 1 shows a relational graph of these expressions (5) to (8). The hatched portion in FIG. 1 represents the mechanical properties of the sealing resin according to the present invention.

Next, the problem of the cracks inside the sealing resin and the interfacial peeling of the LSI chip, the wiring substrate, and so forth, can be solved by optimizing the fillet shape of the sealing resin.

When the sealing resin has a fillet shape that extends from the side surface of the LSI chip in a curved shape and reaches the wiring substrate, the fillet shape needs to satisfy the following relation:

$$S < H \leq S + C \qquad (9)$$

where:

S: height of gap between LSI chip and wiring substrate (mm),

H: height of fillet (mm),

C: thickness of LSI chip (mm), and
L: length of fillet leg.

$$H = L \tag{10}$$

FIG. 2 is a schematic sectional view of the fillet shape of the sealing resin. It is a feature of the present invention that the fillet of the sealing resin hangs on the side surface of the LSI chip, and the range of the fillet height is from the lower end to the upper end of the side surface of the LSI chip.

Next, the problem of erroneous operation of the semiconductor integrated circuit resulting from visible rays can be solved when the sealing resin is colored in black lest the visible rays transmit through the sealing resin. FIG. 3 is a schematic sectional view showing the resin sealed semiconductor device sealed by the sealing resin that is colored in black. FIG. 4 is a schematic sectional view of a resin sealed semiconductor device the sealing resin of which is colored in black into a depth of 200 μm from its surface. It is another feature of the present invention that the sealing resin is colored in black lest the visible rays transmit through the sealing resin. It is sufficient if the sealing resin is colored in black to a depth of at least 200 μm from the surface.

The resin sealed semiconductor device according to the present invention optimizes, and selects suitably, the modulus of longitudinal elasticity and the coefficient of linear thermal expansion of the sealing resin for reducing the strain of the metal bumps such as the solder bumps. The present invention thus improves precisely the fatigue failure of the metal bumps. The resin sealed semiconductor device of the present invention optimizes also the fillet shape of the sealing resin, restricts the cracks occurring inside the sealing resin and the interfacial peeling with the LSI chip, and improves connection reliability of the metal bumps such as the solder bumps.

Furthermore, in the resin sealed semiconductor device according to the present invention, the sealing resin is colored in black so that visible rays can be prevented from being incident on the wiring surface of the LSI chip. The erroneous operation of the semiconductor device such as the LSI chip can be prevented in this way. Owing to these effects, the present invention can provide a resin sealed semiconductor device having high reliability.

DESCRIPTION OF THE EMBODIMENTS

Figure 5:
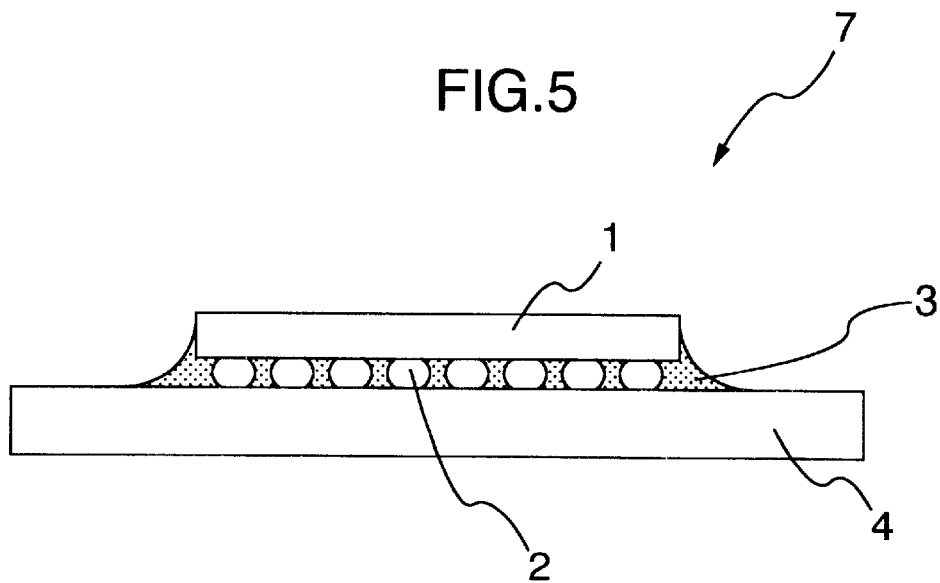
FIG. 5 is a schematic sectional view of a resin sealed semiconductor device according to one embodiment of the present invention.

Preferred embodiments of the present invention will be explained with reference to the accompanying drawings. FIG. 5 is a schematic sectional view of a resin sealed semiconductor device according to an embodiment of the present invention. An LSI chip 1 as a semiconductor chip is connected to a wiring substrate 4 through solder bumps 2. This connection plays the role of electrical connection between the electrodes of the LSI chip 1 and those of the wiring substrate 4 as well as the mechanical connection. An organic resin such as FR-4 can be used advantageously as the material of the wiring substrate 4 in order to obtain good productivity. So-called "glass epoxy", that is obtained by curing a glass fiber cloth with an epoxy resin, is generally used as the material of the organic wiring substrate. On the other hand glass polyimide is sometimes used as the material of the organic wiring substrate on rare occasions. An epoxy resin incorporating glass particles is used practically as a sealing resin of the semiconductor device. Rubber particles, or the like, are often mixed in order to lower the modulus of elasticity.

When an organic resin is used, however, the difference of the coefficient of linear thermal expansion with the LSI chip is great. In consequence, a large strain is likely to develop in the solder bumps 2 due to heat generated during the operation of the semiconductor device, inviting fatigue failure. Therefore, as an object of the present invention, a sealing resin 3 is charged into the gap between the LSI chip 1 and the wiring substrate 4, and plays the role of reinforcement of the solder bumps 2.

TABLE 1

| Symbol | Modulus of longitudinal elasticity E(Mpa) | Coefficient of linear thermal expansion (α ppm/° C.) |
|---|---|---|
| A1 | 3430 | 20 |
| A2 | 3430 | 27 |
| A3 | 3430 | 70 |
| B1 | 7450 | 20 |
| B2 | 7450 | 27 |
| B3 | 7450 | 70 |
| C1 | 146000 | 20 |
| C2 | 146000 | 27 |
| C3 | 146000 | 70 |

Figure 6:
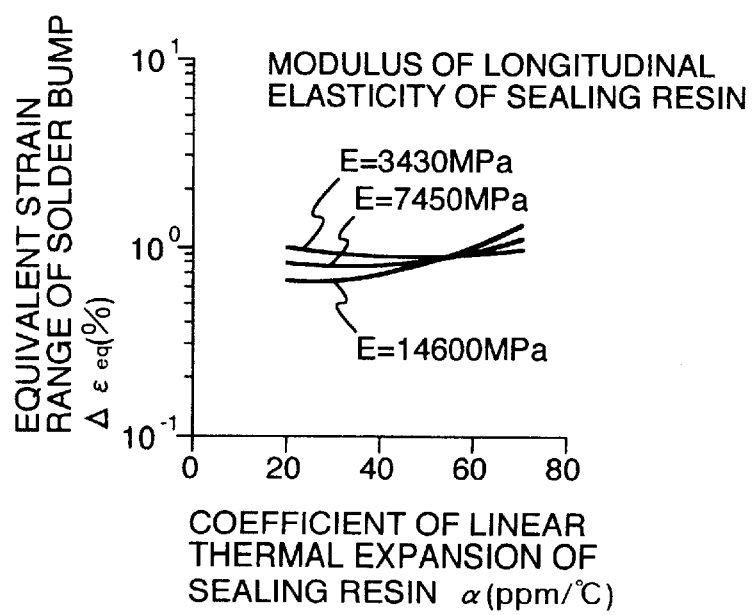
FIG. 6 is a graph showing the relationship between mechanical properties of a sealing resin and the range of an equivalent strain of a solder bump.

FIG. 6 is a graph showing the correlation of the equivalent strain range Δεeq (%), that occurs in the solder bumps 2, the modulus of longitudinal elasticity E (MPa) of the sealing resin 3 and its coefficient of linear thermal expansion α (ppm/° C.). This correlation is obtained in the following way. The modulus of longitudinal elasticity E of the sealing resin 3 of the resin sealed semiconductor device 7 shown in FIG. 5 and its coefficient of linear thermal expansion α are changed in accordance with Table 1, and then the result is obtained by a finite element analysis. The value αεeq is a physical quantity that is well known as having a good agreement with fatigue life of the solder, and is used to represent fatigue life of the solders in general.

It can be appreciated from the result given above that the equivalent strain range αεeq exhibits a distribution of an n-order (where n is an integer) polynomial expression having extreme values when the coefficient of linear thermal expansion is changed with respect to each modulus of longitudinal elasticity E of the sealing resin 3. In other words, if a sealing resin 3 is selected having mechanical properties that lower the equivalent strain range Δεeq of the solder bumps 2, connection life of the solder bumps 2 can be improved.

Figure 7:
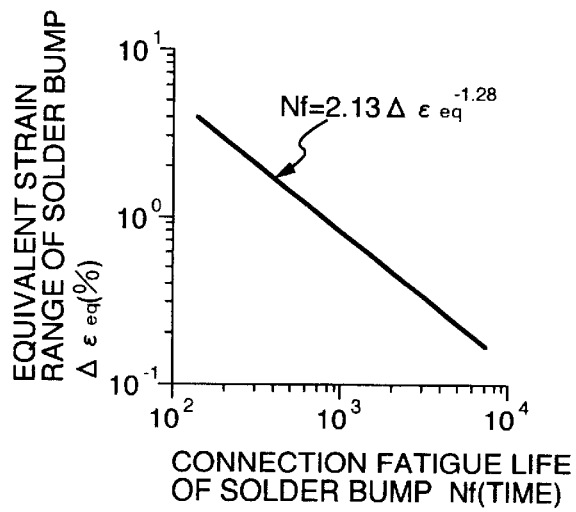
FIG. 7 is a graph showing the relationship between the range of an equivalent strain of a solder bump and connection fatigue life obtained by a temperature cycle test in the present invention.
Figure 8:
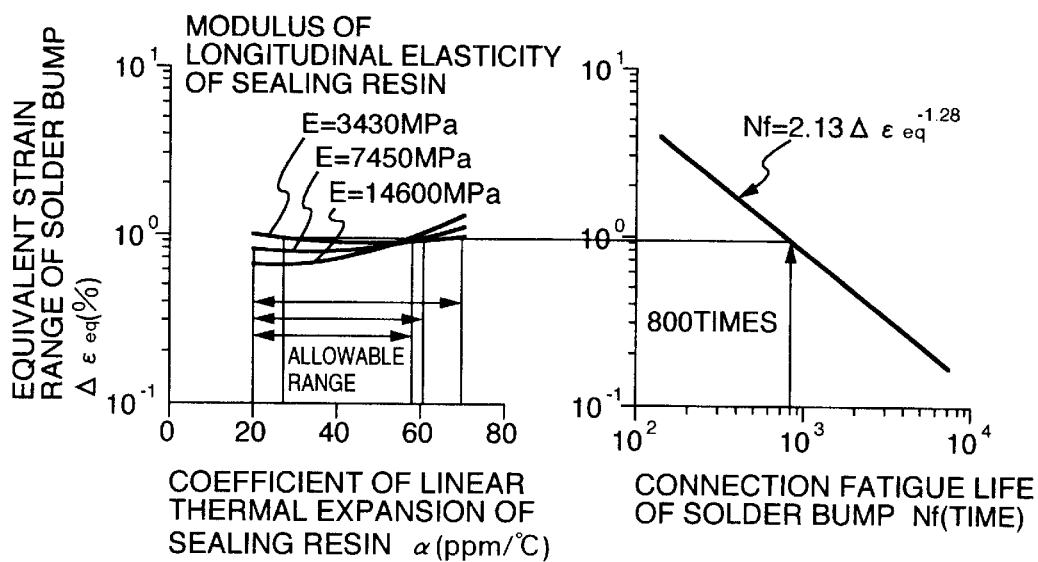
FIG. 8 is a graph showing an appropriate allowable range of the mechanical properties of a sealing resin in a resin sealed semiconductor device according to one embodiment of the present invention.

The inventors of the present invention have conducted temperature cycle tests (reliability tests of semiconductor devices that are generally conducted) for various semiconductor devices on the basis of the result described above, as shown in FIG. 7. The allowable range of those mechanical properties of the sealing resin, that satisfy connection life of the solder bumps 2 shown in FIG. 8, can be determined from the relationship between the resulting equivalent strain range Δεeq of the solder bumps and connection fatigue life obtained by the temperature cycle tests.

Figure 1:
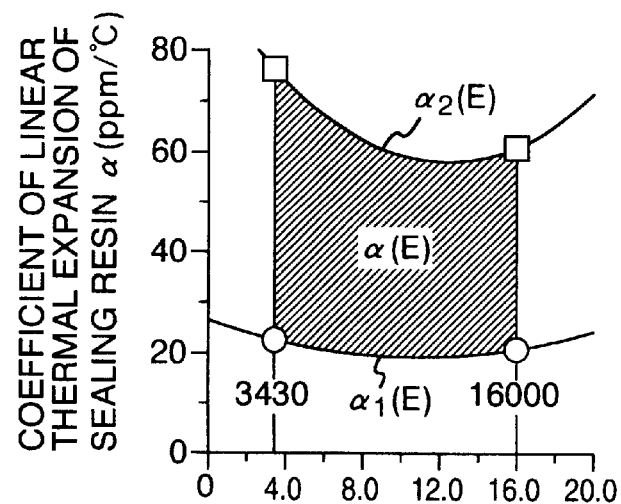
FIG. 1 is a graph showing mechanical properties of a sealing resin of a resin sealed semiconductor device according to an embodiment of the present invention.
Figure 2:
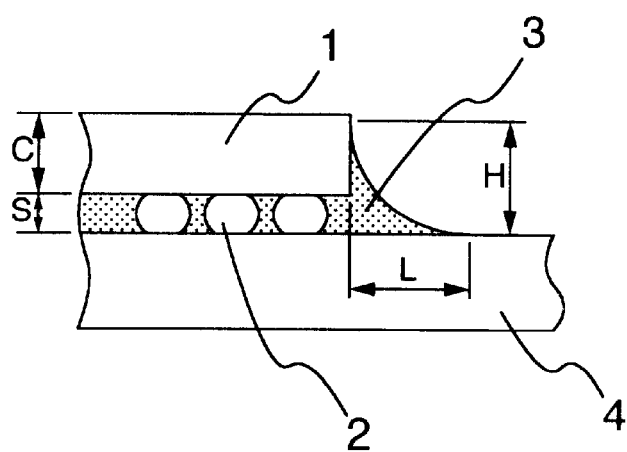
FIG. 2 is a schematic sectional view of a fillet shape of the sealing resin in the present invention.

The present invention assumes that a resin sealed semiconductor device having sufficient reliability can be provided if the device can withstand 800 cycles of the test when the temperature of the temperature cycle tests is within the range of −55 to 125° C. Therefore, the relationship between the modulus of longitudinal elasticity E of the sealing resin and the coefficient of linear thermal expansion α within the allowable range of the coefficient of linear thermal expansion of the sealing resin 3 shown in FIG. 8 exists inside the hatched range in FIG. 1, and expressions (5) to (8) can be derived by expressing this hatched portion by numerical expressions. The upper and lower limit values of the modulus of longitudinal elasticity E of the sealing resin, that is, 16,000 MPa and 3,430 MPa, respectively, are determined as the feasible values by a filler content of the filler-containing epoxy resin of glass, for example, used for the sealing resin. The lower limit value of the coefficient of linear thermal expansion α, i.e. 18 ppm/° C., too, is determined as a feasible value when the upper limit value 16,000 MPa of the modulus of longitudinal elasticity E is determined.

Figure 9:
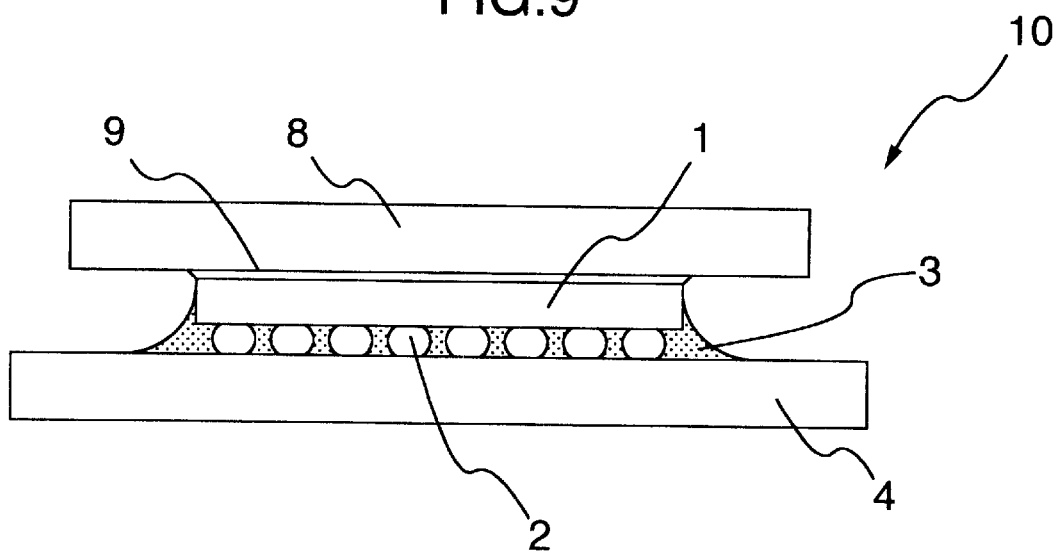
FIG. 9 is a schematic sectional view of a resin sealed semiconductor device capable of coping with high exothermy in an embodiment of the present invention.

Another embodiment of the present invention will be explained with reference to the drawings. FIG. 9 is a schematic sectional view of a resin sealed semiconductor device according to another embodiment of the present invention. The basic construction of this semiconductor device is the same as that of the resin sealed semiconductor device shown in FIG. 5. In this embodiment, however, a heat diffusion plate 8 is fitted by a solder 9 to the back of the LSI chip 1 in order to cope with a semiconductor chip exhibiting high exothermy. The heat diffusion plate 8 is most ideally made of a material having a low coefficient of thermal expansion, a suitable example of which is aluminum nitride. The material of the wiring substrate 4 must be able to withstand the high temperature, and those materials which are readily available and relatively economical, such as alumina etc., can be used advantageously from the aspect of productivity.

As described above, fatigue failure of the solder bumps 2 can be prevented by optimizing the mechanical properties of the sealing resin 3. However, even when the mechanical properties of the sealing resin 3 are optimized and fatigue failure of the solder bumps 2 is avoided, cracks occurring in the sealing resin 3, the interfacial peel, and so forth, cannot always be avoided. In order to provide a high reliability resin sealed semiconductor device, therefore, the cracks inside the sealing resin 3 and interfacial peeling must be suppressed.

Figure 10:
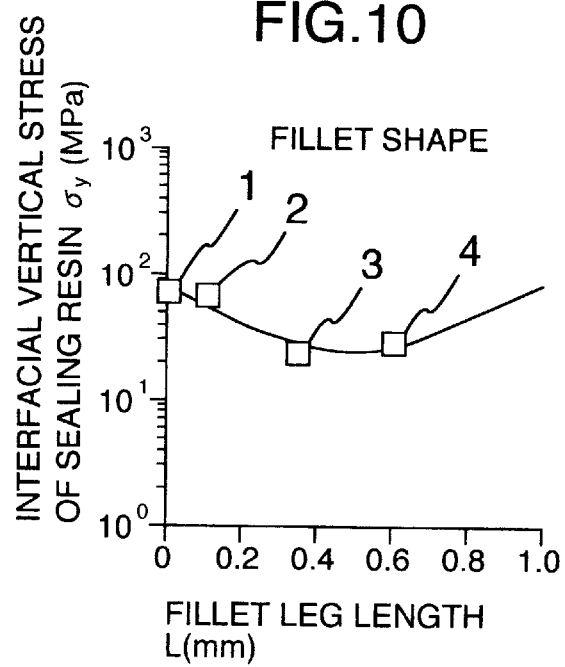
FIG. 10 is a graph showing the relationship between an interfacial vertical stress occurring in a sealing resin and a fillet leg length in a resin sealed semiconductor device.

FIG. 10 shows the relationship between the length of a fillet leg and an interfacial vertical stress σy occurring at the interfacial edge of the sealing resin 3 with the wired surface of the LSI chip 1. The finite element analysis of four different kinds of fillet shapes, shown in FIGS. 11A to 11D, of the sealing resin 3 of the resin sealed semiconductor device 10 of the present invention was conducted to obtain the result described above. This semiconductor device is so designed as to cope with high exothermy, and is shown in FIG. 9.

Figure 11A:
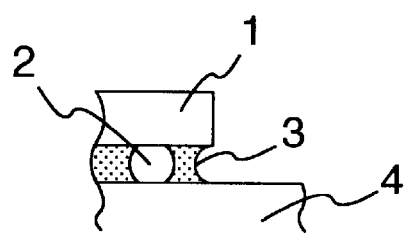
FIGS. 11A to 11D are sectional views each showing the appearance of a fillet shape in a resin sealed semiconductor device according to one embodiment of the present invention.
Figure 11B:
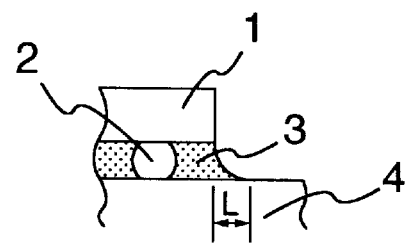
Figure 11C:
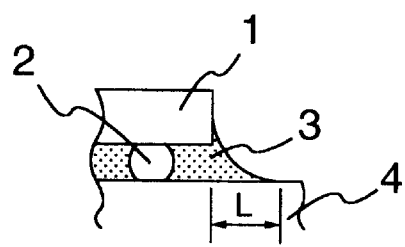
Figure 11D:
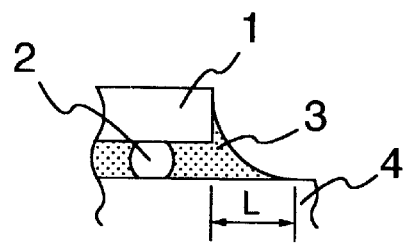

The shape 1 in FIG. 11A represents the case where the sealing resin 3 exists inside the gap between the LSI chip 1 and the wiring substrate 4 and the fillet leg length is 0 mm. The shapes 2 to 4 shown in Figs. 11B to 11D represent the cases where the length of the fillet leg is equal to the height of the fillet. The fillet has an ideal shape such that it extends from the lower end or the side surface of the LSI chip in a curved figure represented by the function of the second order and reaches the wiring substrate 4.

As can be appreciated clearly from FIG. 10, σy can be reduced when the fillet of the sealing resin 3 has the shape 3 or 4 that extends to, and hangs on, the side surface of the LSI chip 1. When the fillet exists beneath the lower surface or from the lower end of the side surface of the LSI chip 1 as in the shapes 1 or 2, σy is great, and cracks and interfacial peeling inside the sealing resin are believed likely to occur. In consequence, a resin sealed semiconductor device having high reliability can be provided when the fillet shape of the sealing resin 3 exists from the side surface of the LSI chip 1 and has a fillet leg length equal to the fillet height. In this instance, expressions (9) and (10) can be derived. Here, the upper and lower limit values of the fillet height are inevitably determined by the thickness of the LSI chip 1 and the height of the solder bump 2.

Figure 3:
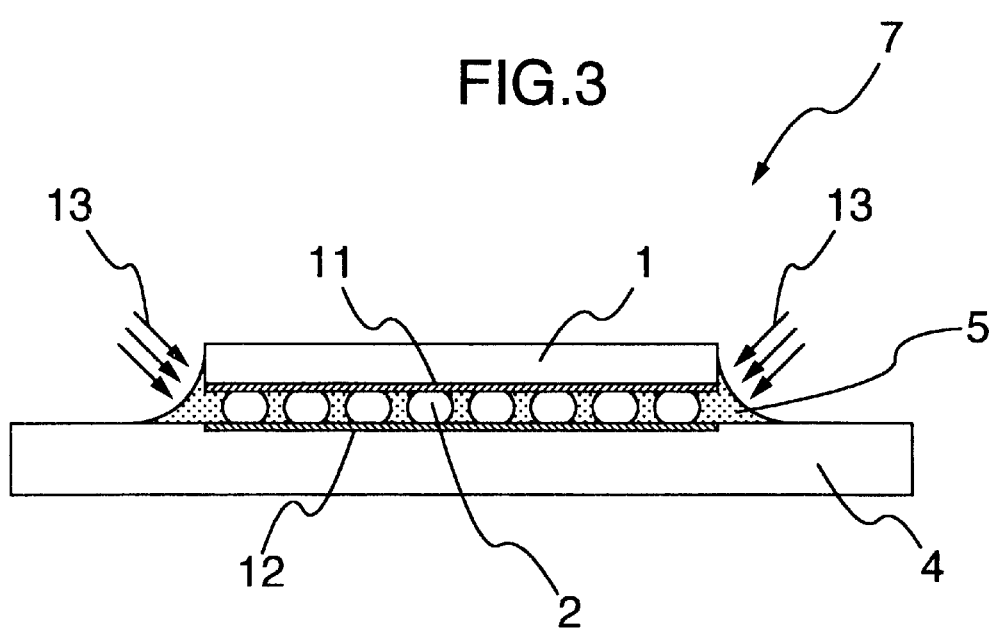
FIG. 3 is a schematic sectional view of a resin sealed semiconductor device sealed by a sealing resin that is colored in black in the present invention.

Still another embodiment of the present invention will be explained with reference to the drawings. FIG. 3 is a schematic sectional view of a resin sealed semiconductor device 5 according to this embodiment that is sealed by a sealing resin 5 colored in black. The sealing resin 5 colored in black is charged into a gap portion between the LSI chip 1 and the wiring substrate 4, and, by virtue of this thermal fatigue life of the solder bumps 2 can be improved. In this way, the wiring surface 11 of the LSI chip 1 and the wiring surface 12 of the wiring substrate 4 can be protected from the visible rays 13 and the erroneous operation of the resin sealed semiconductor device 7 can be prevented.

Figure 4:
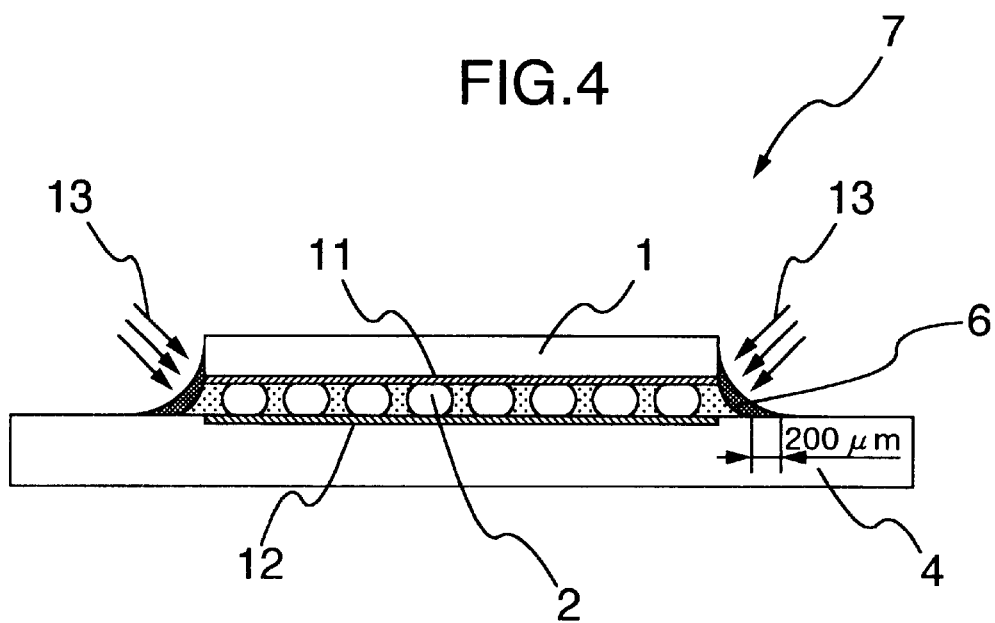
FIG. 4 is a schematic sectional view of a resin sealed semiconductor device sealed by a sealing resin that is colored in black to a depth of 200 μm from the surface in the present invention.

The sealing resin 5 colored in black can be produced easily by merely adding a black dye to epoxy resins that are generally readily available as the sealing resin. It is known that incidence of the visible rays 13 can be prevented when the surface of the sealing resin is colored in black to a depth of at least 200 µm from the surface. Therefore, if the epoxy resin as the ordinary sealing resin is charged and the black dye 6 is then applied to the surface of the sealing resin 3 to a thickness of at least 200 µm as shown in FIG. 4, the production cost can be lowered much more than when the black sealing resin 5 is produced in the way described above for FIG. 3.

To clarify further the content of the present invention, the following will illustrate an example of the mechanical properties of the constituent materials.

(1) silicon:
  modulus of longitudinal elasticity E=170 GPa,
Poisson's ratio ν=0.066, coefficient of linear thermal expansion α=3 ppm/° C.
(2) metal bump (40%Pb–60%Sn):
  E=15.2 GPa, ν=0.27, α=19.9 ppm/° C.
(3) wiring substrate (FR-4):
  E=17 Gpa, ν=0.16, α=11 ppm/° C.

What is claimed is:

1. A resin sealed semiconductor device comprising:
  a wiring substrate made of an organic resin;
  an LSI chip constituted by a semiconductor integrated circuit and mounted in a bare chip package form on said wiring substrate by a plurality of electrical bonding members; and
  a resin charged into a gap portion between said organic resin wiring substrate and said LSI chip;
  wherein a modulus of longitudinal elasticity E (MPa) of said resin charged is within the range of $3{,}430 \leq E \leq 16{,}000$, and its coefficient of linear thermal expansion α (ppm/° C.) satisfies the following expression (1):

Expression (1):
$$\alpha_1(E) \leq \alpha(E) \leq \alpha_2(E) \quad (1)$$

where:
Expression (2):
$$\alpha_1(E) = 6.24 \times 10^{-8} E^2 - 1.38 \times 10^{-3} E + 26.8 \quad (2)$$

Expression (3):
$$\alpha_2(E) = 2.28 \times 10^{-7} E^2 - 5.69 \times 10^{-3} E + 93.6 \quad (3)$$

Expression (4):
$$3{,}430 \leq E \leq 16{,}000 \quad (4)$$

α: coefficient of linear thermal expansion of said resin (ppm/° C.), and
E: modulus of longitudinal elasticity of said resin (MPa).

2. A resin sealed semiconductor device according to claim 1, wherein said resin has a fillet extending from the side surface of said LSI chip and reaching said wiring substrate, in a curved form and said fillet has a shape satisfying the following relation:

$$S < H \leq S + C \quad (5)$$

where:
$$H = L \quad (6)$$

S: height of said gap (mm),
H: height of said fillet (mm),
C: thickness of said LSI chip (mm), and
L: length of leg of said fillet (mm).

3. A resin sealed semiconductor device according to claim 1, wherein said resin is a resin that is colored in black.

4. A resin sealed semiconductor device according to claim 1, wherein said resin is colored to a depth of at least 200 μm from the surface thereof.

5. A resin sealed semiconductor device according to claim 4, wherein said resin is colored in black to a depth of at least 200 μm from the surface thereof.

6. A resin sealed semiconductor device according to claim 1, wherein said resin is charged into said gap portion at a periphery of said electrical bonding members.

7. A resin sealed semiconductor device according to claim 1, wherein said electrical bonding members are solder bumps.

8. A resin sealed semiconductor device according to claim 6, wherein said electrical bonding members are solder bumps.

9. A resin sealed semiconductor device according to claim 1, wherein said resin is a filler-containing epoxy resin and wherein the modulus of longitudinal elasticity E of said resin is charged within the range of $3{,}340 \leq E \leq 16{,}000$ by setting a filler content of the filler-containing epoxy resin.

10. A resin sealed semiconductor device comprising:
  a wiring substrate;
  a semiconductor chip mounted on said wiring substrate by a plurality of electrical bonding members; and
  a resin charged into a gap portion between said wiring substrate and said chip;
  wherein a modulus of longitudinal elasticity E (MPa) of said resin charged is within the range of $3{,}430 \leq E \leq 16{,}000$, and its coefficient of linear thermal expansion α (ppm/° C.) satisfies the following expression (1):

Expression (1):
$$\alpha_1(E) \leq \alpha(E) \leq \alpha_2(E) \quad (1)$$

where:
Expression (2):
$$\alpha_1(E) = 6.24 \times 10^{-8} E^2 - 1.38 \times 10^{-3} E + 26.8 \quad (2)$$

Expression (3):
$$\alpha_2(E) = 2.28 \times 10^{-7} E^2 - 5.69 \times 10^{-3} E + 93.6 \quad (3)$$

Expression (4):
$$3{,}430 \leq E \leq 16{,}000 \quad (4)$$

α: coefficient of linear thermal expansion of said resin (ppm/° C.), and
E: modulus of longitudinal elasticity of said resin (MPa).

* * * * *